US011101298B2

(12) United States Patent
Lee et al.

(10) Patent No.: US 11,101,298 B2
(45) Date of Patent: Aug. 24, 2021

(54) THIN FILM TRANSISTOR ARRAY SUBSTRATE, DISPLAY APPARATUS, AND METHOD OF MANUFACTURING THIN FILM TRANSISTOR ARRAY SUBSTRATE (71) Applicant: SAMSUNG DISPLAY CO., LTD., Yongin-si (KR)

(72) Inventors: Jinwoo Lee, Yongin-si (KR); Waljun Kim, Yongin-si (KR); Kiwan Ahn, Yongin-si (KR); Yongjae Jang, Yongin-si (KR); Jaehyuk Jang, Yongin-si (KR); Yugwang Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/884,182

(22) Filed: May 27, 2020

(65) Prior Publication Data
US 2020/0295048 A1 Sep. 17, 2020

Related U.S. Application Data (62) Division of application No. 16/047,248, filed on Jul. 27, 2018, now Pat. No. 10,700,104.

(30) Foreign Application Priority Data

Aug. 8, 2017 (KR) .................. 10-2017-0100450

(51) Int. Cl.
*H01L 27/12* (2006.01)
*H01L 29/423* (2006.01)
(Continued)

(52) U.S. Cl.
CPC ......... *H01L 27/124* (2013.01); *G09G 3/3233* (2013.01); *G09G 3/3266* (2013.01);
(Continued)

(58) Field of Classification Search
CPC ............... H01L 27/124; H01L 27/1225; H01L 27/1255; H01L 27/1262; H01L 27/3262;
(Continued)

(56) References Cited

U.S. PATENT DOCUMENTS

2006/0043874 A1* 3/2006 Hwang .................. H01J 9/022
313/495
2006/0124933 A1 6/2006 Kang
(Continued)

FOREIGN PATENT DOCUMENTS

KR 1020060098255 9/2006
KR 1020160117233 10/2016

*Primary Examiner* — Chuong A Luu
(74) *Attorney, Agent, or Firm* — F. Chau & Associates, LLC (57) ABSTRACT A thin film transistor array substrate includes: a first conductive layer including first lines for transmitting data signals to the thin film transistors; a second conductive layer disposed on the first conductive layer and including second lines for supplying a driving voltage to the thin film transistors; a first insulating layer disposed between a semiconductor layer and the first conductive layer and including a first material layer; a second insulating layer disposed between the first conductive layer and the second conductive layer and including a second material layer having a dielectric constant greater than that of the first material layer; and a contact plug penetrating the second insulating layer and the first insulating layer, and connecting the second conductive layer to the semiconductor layer. A taper angle of the contact plug in the second material layer is greater than that of the contact plug in the first material layer.

9 Claims, 7 Drawing Sheets (51) Int. Cl.
*G09G 3/3266* (2016.01)
*G09G 3/3275* (2016.01)
*H01L 29/417* (2006.01)
*G09G 3/3233* (2016.01)
*H01L 29/786* (2006.01)
*H01L 27/32* (2006.01)

(52) U.S. Cl.
CPC ....... *G09G 3/3275* (2013.01); *H01L 27/1225* (2013.01); *H01L 27/1255* (2013.01); *H01L 27/1262* (2013.01); *H01L 29/41733* (2013.01); *H01L 29/42384* (2013.01); *G09G 2300/0852* (2013.01); *G09G 2310/0251* (2013.01); *G09G 2310/0262* (2013.01); *H01L 27/3262* (2013.01); *H01L 29/7869* (2013.01)

(58) Field of Classification Search
CPC ........... H01L 29/7869; H01L 29/42384; H01L 29/41733; H01L 27/12; H01L 27/13; H01L 27/32; H01L 27/3248; H01L 27/3272; H01L 27/1229; H01L 27/1233; H01L 27/1237; H01L 27/1251; H01L 27/1214; H01L 29/66; H01L 29/786; H01L 29/417; H01L 29/423; H01L 29/66742; H01L 29/4908; H01L 29/6678; H01L 29/78696
USPC .......................................... 438/48, 128, 149
See application file for complete search history.

(56) References Cited

U.S. PATENT DOCUMENTS

| | | |
|---|---|---|
| 2008/0265254 A1 | 10/2008 | Nishiura |
| 2016/0163780 A1 | 6/2016 | Park |
| 2016/0247837 A1 | 8/2016 | Shi et al. |
| 2016/0293732 A1 | 10/2016 | Kurata et al. |
| 2017/0084643 A1 | 3/2017 | Saraf et al. |
| 2017/0271433 A1* | 9/2017 | Wang ...................... H01L 28/60 |
| 2019/0051669 A1 | 2/2019 | Lee et al. |

* cited by examiner

FIG. 4D

THIN FILM TRANSISTOR ARRAY SUBSTRATE, DISPLAY APPARATUS, AND METHOD OF MANUFACTURING THIN FILM TRANSISTOR ARRAY SUBSTRATE

CROSS-REFERENCE TO RELATED APPLICATION

This application is a divisional application of U.S. patent application Ser. No. 16/047,248, filed on Jul. 27, 2018, which claims the benefit under 35 U.S.C. § 119 of Korean Patent Application No. 10-2017-0100450, filed on Aug. 8, 2017, in the Korean Intellectual Property Office, the disclosure of which is incorporated by reference herein in its entirety.

TECHNICAL FIELD

Exemplary embodiments relate to a thin film transistor array substrate, a display apparatus, and a method of manufacturing the thin film transistor array substrate, and more particularly, to a thin film transistor array substrate for implementing a high-resolution panel having enhanced brightness and gradation quality in grayscale, a display apparatus, and a method of manufacturing the thin film transistor array substrate.

DISCUSSION OF RELATED ART

Compared to a semiconductor device using a semiconductor substrate, when a thin film transistor is manufactured using a semiconductor thin film formed on a glass substrate, manufacturing costs may be reduced, and large-scaled processes may be easily performed. Thus, a thin film semiconductor device such as a flat display device, e.g., a liquid crystal display device or an organic light-emitting display device, has been used in various fields.

The organic light-emitting display device has high brightness, low driving voltage, self-emission, high contrast ratio, and fast response rates of several micro-seconds (μs) to stably display moving images. In addition, the organic light-emitting display device has no limitation on viewing angles, and stably operates at a low temperature and at a low DC voltage between about 5 V to about 15 V. Thus, it is easy to design and manufacture a driving circuit for the organic light-emitting display device, and manufacturing processes are simple.

Such an organic light-emitting display device may include thin film transistors and capacitors to control emission of pixels. In this case, as the pixels gradually decrease in size during implementation of a high-resolution panel, gradation presentation by a data voltage of each pixel may become non-uniform. In order to overcome the non-uniformity, the number of capacitors may increase, but it is difficult to secure capacity of the capacitors due to the reduced sizes of the pixels.

SUMMARY

Exemplary embodiments of the present disclosure include a thin film transistor array substrate for implementing a high-resolution panel having enhanced brightness and gradation quality in grayscale, a display apparatus, and a method of manufacturing the thin film transistor array substrate. However, the embodiments are merely examples, and the present disclosure is not limited thereto.

Additional aspects will be set forth in part in the description which follows and, in part, will be apparent from the description, or may be learned by practice of the presented embodiments.

According to an exemplary embodiment of the present disclosure, a thin film transistor array substrate includes: a substrate; a semiconductor layer disposed on the substrate and including active areas of a plurality of thin film transistors; a first conductive layer disposed on the semiconductor layer and including a plurality of first lines for transmitting data signals to the plurality of thin film transistors; a second conductive layer disposed on the first conductive layer and including a plurality of second lines for supplying a driving voltage to the plurality of thin film transistors; a first insulating layer disposed between the semiconductor layer and the first conductive layer and including a first material layer having a first dielectric constant; a second insulating layer disposed between the first conductive layer and the second conductive layer and including a second material layer having a second dielectric constant that is greater than the first dielectric constant; and a contact plug penetrating the second insulating layer and the first insulating layer and connecting the second conductive layer to the semiconductor layer, in which a second taper angle of the contact plug in the second material layer is greater than a first taper angle of the contact plug in the first material layer.

The thin film transistor array substrate may further include a first capacitor that includes a portion of the first conductive layer as a lower electrode and a portion of the second conductive layer as an upper electrode.

The second material layer may include at least one of zirconium oxide ($ZrO_2$), titanium oxide ($TiO_2$), tantalum pentoxide ($Ta_2O_5$), aluminum oxide ($Al_2O_3$), strontium titanate ($SrTiO_3$), and barium titanate ($BaTiO_3$).

The second conductive layer may include source electrodes and drain electrodes of the plurality of thin film transistors.

The thin film transistor array substrate may further include a first gate layer and a second gate layer between the semiconductor layer and the first insulating layer, in which the first gate layer may include gate electrodes of the plurality of thin film transistors, and the second gate layer may be on the first gate layer and may include a plurality of third lines for transmitting a scan signal and a control signal to the plurality of thin film transistors.

The thin film transistor array substrate may further include a second capacitor that includes one gate electrode of the first gate layer as a lower electrode and a portion of the second gate layer as an upper electrode.

The thin film transistor array substrate may further include a third insulating layer disposed between the first gate layer and the second gate layer and including a third material layer having a third dielectric constant.

The third dielectric constant may be greater than the first dielectric constant, and a third taper angle of the contact plug in the third material layer may be greater than the first taper angle of the contact plug in the first material layer.

The third material layer may include at least one of $ZrO_2$, $TiO_2$, $Ta_2O_5$, $Al_2O_3$, $SrTiO_3$, and $BaTiO_3$.

According to an exemplary embodiment of the present disclosure, a display apparatus includes: a substrate; a thin film transistor disposed on the substrate, configured to drive pixels, and including an active area, a gate electrode, a source electrode, and a drain electrode; a first capacitor including a second conductive pattern as an upper electrode and a first conductive pattern as a lower electrode, in which the second conductive pattern is on a layer the same as that of the source electrode and the drain electrode, and the first conductive pattern overlaps at least a portion of the second conductive pattern; a first insulating layer disposed between the gate electrode and the first conductive pattern and including a first material layer having a first dielectric constant; a second insulating layer disposed between the first conductive pattern and the second conductive pattern and including a second material layer having a second dielectric constant; and a contact plug penetrating the second insulating layer and the first insulating layer and connecting the second conductive pattern to the active area, in which a second taper angle of the contact plug in the second material layer is greater than a first taper angle of the contact plug in the first material layer.

The display apparatus may further include a second capacitor that includes the gate electrode as a lower electrode, and a third conductive pattern as an upper electrode. The third conductive pattern may be on a layer between the gate electrode and the first insulating layer, and at least a portion of the third conductive pattern may overlap the gate electrode.

The display apparatus may further include a third insulating layer disposed between the gate electrode and the third conductive pattern and including a third material layer having a third dielectric constant.

The third dielectric constant may be greater than the first dielectric constant, and a third taper angle of the contact plug in the third material layer may be greater than the first taper angle of the contact plug in the first material layer.

According to an exemplary embodiment of the present disclosure, a method of manufacturing a thin film transistor array substrate includes: forming a semiconductor layer on a substrate; forming, on the semiconductor layer, a first insulating layer including a first material layer having a first dielectric constant; forming a first conductive layer on the first insulating layer; forming, on the first conductive layer, a second insulating layer including a second material layer having a second dielectric constant greater than the first dielectric constant; forming, on the second insulating layer, a mask layer including an opening; removing a portion of the second insulating layer exposed by wet etching through the opening; forming a through hole extending to the semiconductor layer by removing a portion of the first insulating layer exposed by dry etching through the opening; and forming a second conductive layer to cover the through hole.

The second material layer may include at least one of zirconium oxide ($ZrO_2$), titanium oxide ($TiO_2$), tantalum pentoxide ($Ta_2O_5$), aluminum oxide ($Al_2O_3$), strontium titanate ($SrTiO_3$), and barium titanate ($BaTiO_3$).

The method may further include sequentially forming a first gate layer, a third insulating layer, and a second gate layer between the semiconductor layer and the first insulating layer.

The third insulating layer may include a third material layer having a third dielectric constant, and the third dielectric constant may be greater than the first dielectric constant.

The third material layer may include at least one of $ZrO_2$, $TiO_2$, $Ta_2O_5$, $Al_2O_3$, $SrTiO_3$, and $BaTiO_3$.

The forming of the through hole may include removing a portion of the third insulating layer exposed by wet etching through the opening.

The forming of the second conductive layer may include forming a contact plug that connects the second conductive layer to the semiconductor layer by filling the through hole.

According to an exemplary embodiment of the present disclosure, a thin film transistor array substrate includes: a substrate; a semiconductor layer disposed on the substrate and including active areas of thin film transistors; a first conductive layer disposed on the semiconductor layer and including first lines for transmitting data signals to the thin film transistors; a second conductive layer disposed on the first conductive layer and including second lines for supplying a driving voltage to the thin film transistors; a first insulating layer disposed between the semiconductor layer and the first conductive layer and including a first material layer; a second insulating layer disposed between the first conductive layer and the second conductive layer and including a second material layer; and a contact plug penetrating the second insulating layer and the first insulating layer and connecting the second conductive layer to the semiconductor layer, in which a second taper angle of the contact plug in the second material layer is greater than a first taper angle of the contact plug in the first material layer, and the second material layer has a dielectric constant greater than that of silicon oxide ($SiO_2$) or silicon nitride ($SiN_x$).

The thin film transistor array substrate may further include a capacitor that includes a portion of the first conductive layer as a lower electrode and a portion of the second conductive layer as an upper electrode.

The second material layer may include one or more of hafnium oxide ($HfO_2$), hafnium silicon oxide ($HfSiO_x$), hafnium aluminum oxide ($HfAlO_x$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and lead zinc niobate ($Pb(Zn_{1/3}Nb_{2/3})O_3$).

The first material layer may include silicon oxide ($SiO_2$), silicon nitride ($SiN_x$), or combinations thereof.

BRIEF DESCRIPTION OF THE DRAWINGS

These and/or other aspects will become apparent and more readily appreciated from the following description of the embodiments, taken in conjunction with the accompanying drawings in which.

Since the drawings in FIGS. 1-4D are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of related art are omitted when it is deemed that they may unnecessarily obscure the essence of the disclosure.

While such terms as "first", "second", "third", etc., may be used to describe various components, such components should not be limited by these terms. These terms are used only to distinguish one component from another.

It will be understood that when a layer, region, or component is referred to as being "formed on" another layer, region, or component, it can be directly or indirectly formed on the other layer, region, or component. That is, for example, intervening layers, regions, or components may be present.

Reference will now be made in detail to embodiments of the present disclosure, examples of which are illustrated in the accompanying drawings. Like reference numerals refer to like elements throughout, and thus their repeated descriptions will be omitted. Expressions such as "at least one of", when preceding a list of elements, modify the entire list of elements and do not modify the individual elements of the list.

Figure 1:
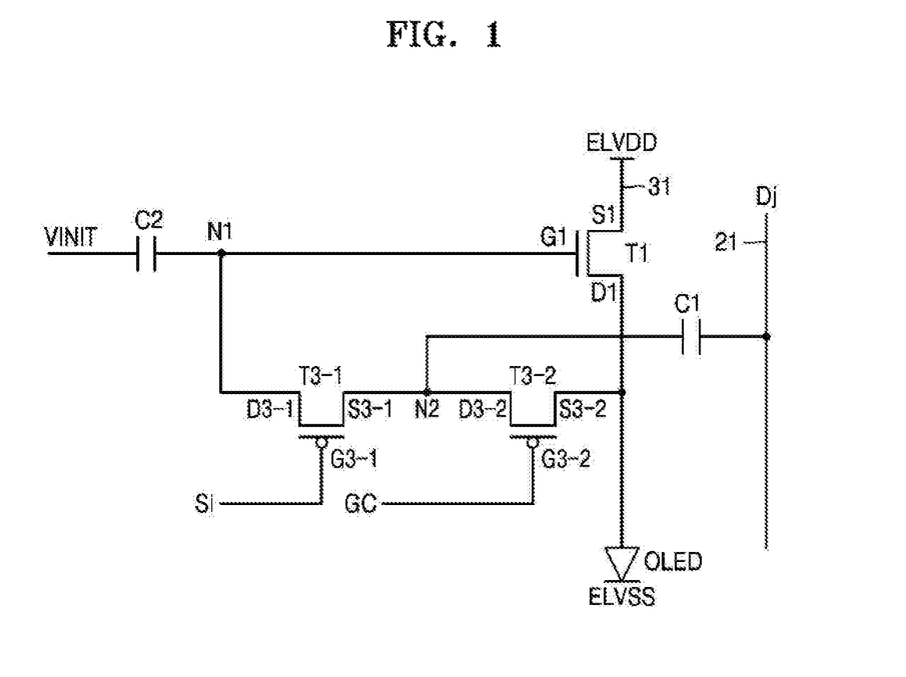
FIG. 1 is a circuit diagram of a pixel of a display apparatus using a thin film transistor array substrate according to an exemplary embodiment of the present disclosure.
Figure 2:
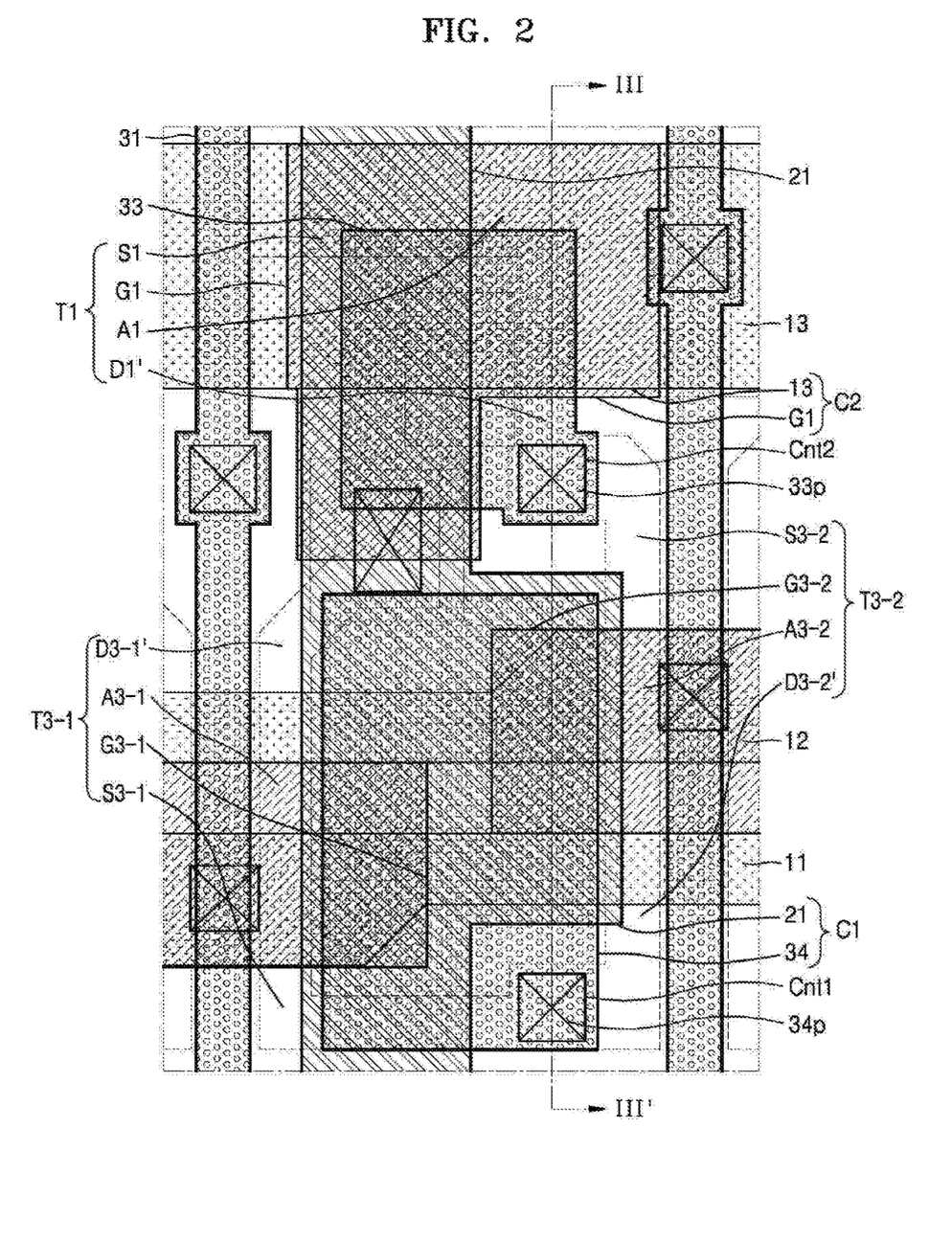
FIG. 2 is a schematic plan view of a circuit of a pixel of a display apparatus using a thin film transistor array substrate according to an exemplary embodiment of the present disclosure.
Figure 3:
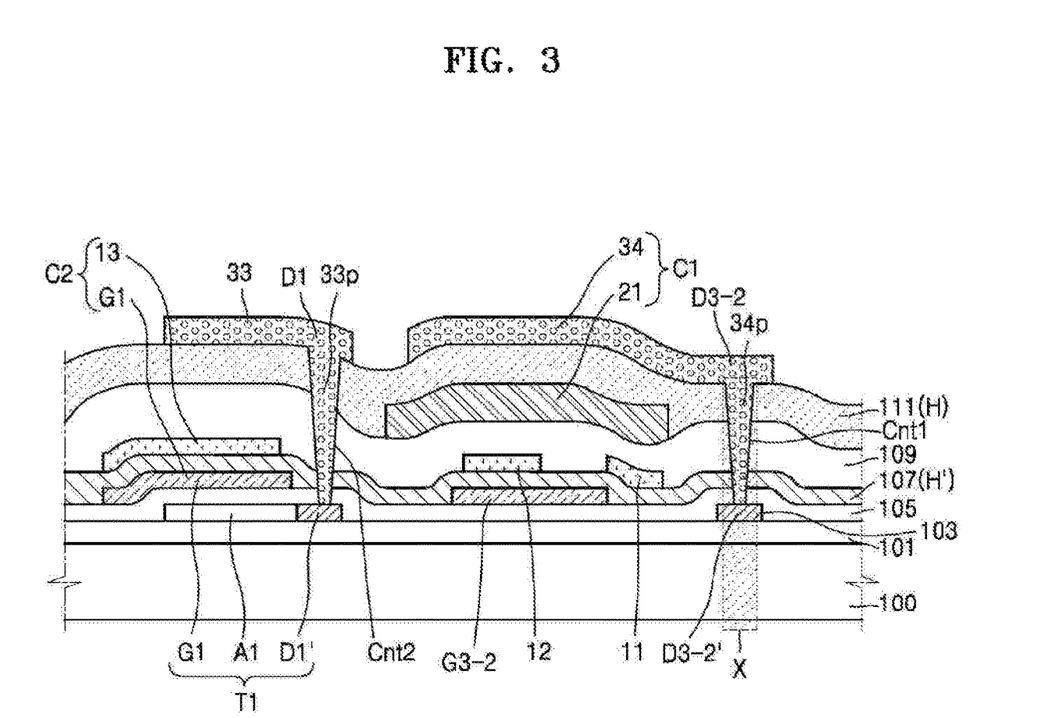
FIG. 3 is a cross-sectional view taken along line III-III' of FIG. 2.

FIG. 1 is a circuit diagram of a pixel of a display apparatus using a thin film transistor array substrate according to an exemplary embodiment of the present disclosure. FIG. 2 is a schematic plan view of a circuit of a pixel of a display apparatus using the thin film transistor array substrate according to an exemplary embodiment of the present disclosure. FIG. 3 is a cross-sectional view taken along line III-III' of FIG. 2.

Referring to FIG. 1, the pixel includes an organic light-emitting diode (OLED) and a pixel circuit for supplying a current to the OLED. The pixel circuit includes first to third thin film transistors T1, T3-1, and T3-2, and first and second capacitors C1 and C2.

The first thin film transistor T1 includes a first gate electrode G1 connected to a first node N1, a first source electrode S1 connected to a power line 31 for supplying a first power voltage ELVDD, and a first drain electrode D1 connected to a pixel electrode of the OLED. The first thin film transistor T1 functions as a driving transistor and is turned on and off by a voltage of the first node N1, thus controlling a current supplied to the OLED.

The second thin film transistor T3-1 includes a second gate electrode G3-1 connected to a scan line for transmitting a scan signal Si, a second drain electrode D3-1 connected to the first node N1, and a second source electrode S3-1 connected to a second node N2. The second thin film transistor T3-1 functions as a switching transistor and is turned on by the scan signal Si transmitted by the scan line.

The third thin film transistor T3-2 includes a third gate electrode G3-2 connected to a compensation control line, a third drain electrode D3-2 connected to the second source electrode S3-1 of the second thin film transistor T3-1 through the second node N2, and a third source electrode S3-2 connected to the pixel electrode of the OLED and the first drain electrode D1 of the first thin film transistor T1. When the third thin film transistor T3-2 is turned on by a compensation control signal GC transmitted to the third gate electrode G3-2 of the third thin film transistor T3-2, the first thin film transistor T1 may be diode-connected.

The first capacitor C1 functions as a channel capacitor connected between the second node N2 and a data line 21 transmitting a data signal Dj and preventing gradation non-uniformity. The second capacitor C2 functions as a storage capacitor connected between the first node N1, which is connected to the first gate electrode G1 of the first thin film transistor T1 and the second drain electrode D3-1 of the second thin film transistor T3-1, and a voltage line supplying an initialization voltage VINIT.

The pixel electrode of the OLED is connected to the pixel circuit, and an opposite electrode of the OLED is connected to a power supply for supplying a second power voltage ELVSS. Thus, the OLED emits light having certain brightness in response to a current supplied from the pixel circuit.

Referring to FIGS. 1 to 3, a buffer layer 101 is on a substrate 100, and a semiconductor layer 103 including active areas A1, A3-1, and A3-2 of the first to third thin film transistors T1, T3-1, and T3-2, respectively, is formed on the buffer layer 101. FIG. 3 shows: a portion of the active area A1 of the first thin film transistor T1 that is the driving thin film transistor, the portion not being doped with impurities; an active area D1' connected to the first drain electrode D1 and doped with impurities; and an active area D3-2' connected to the third drain electrode D3-2 of the third thin film transistor T3-2 and doped with impurities.

A gate insulating layer 105 is formed on the semiconductor layer 103. On the gate insulating layer 105, a first gate layer including the first to third gate electrodes G1, G3-1, and G3-2 of the first to third thin film transistors T1, T3-1, and T3-2, respectively, is formed. In this case, the first gate electrode G1 of the first thin film transistor T1 functions as a lower electrode of the second capacitor C2.

A third insulating layer 107 is formed on the gate insulating layer 105 to cover the first gate layer. The third insulating layer 107 may function as a dielectric layer of the second capacitor C2 and thus may include a material having a high dielectric constant so as to increase capacity of the second capacitor C2. The capacitance (capacity) of the second capacitor C2 may be adjusted by changing the dielectric constant and dimension of the dielectric layer (the third insulating layer 107) formed between the electrodes, and the higher the dielectric constant of the dielectric layer, the larger the capacitance of the second capacitor C2. In an exemplary embodiment of the present disclosure, the third insulating layer 107 may include a material layer including at least one of zirconium oxide ($ZrO_2$), titanium oxide ($TiO_2$), tantalum pentoxide ($Ta_2O_5$), aluminum oxide ($Al_2O_3$), strontium titanate ($SrTiO_3$), and barium titanate ($BaTiO_3$). Other suitable high dielectric constant (high-k) materials may also be used for the third insulating layer 107. However, the present disclosure is not limited thereto. For example, to simplify the manufacturing process, the third insulating layer 107 may include silicon oxide ($SiO_2$), silicon nitride ($SiN_x$), or the like.

FIG. 3 shows that the third insulating layer 107 is a single layer, but the present disclosure is not limited thereto. For example, the third insulating layer 107 may have a stack structure including multiple insulating layers. In this case, the stack structure may be a structure in which an inorganic insulating layer including, e.g., $SiO_2$, $SiN_x$, or the like, is stacked on a metal layer or a metal layer doped with impurities.

A second gate layer is formed on the third insulating layer 107, and includes third lines 11 to 13 transmitting a scan signal and a control signal to the first to third thin film transistors T1, T3-1, and T3-2. In this case, a part of the second gate layer, e.g., the third line 13, functions as an upper electrode of the second capacitor C2.

A first insulating layer 109 is formed on the third insulating layer 107 to cover the second gate layer, and may include an inorganic insulating layer including $SiO_2$, $SiN_x$, or the like.

A first conductive layer is formed on the first insulating layer 109, and includes first lines 21 transmitting data signals to the first to third thin film transistors T1, T3-1, and T3-2. In this case, a part of the first conductive layer, i.e., the first line 21, functions as a lower electrode of the first capacitor C1.

A second insulating layer 111 is formed on the first insulating layer 109 to cover the first conductive layer, may function as a dielectric layer of the first capacitor C1, and may include a material having a high dielectric constant so as to increase capacity of the first capacitor C1. In an exemplary embodiment of the present disclosure, the second insulating layer 111 may include a material including at least one of $ZrO_2$, $TiO_2$, $Ta_2O_5$, $Al_2O_3$, $SrTiO_3$, and $BaTiO_3$.

In general, the second insulating layer 111 may include a high-k dielectric material with a dielectric constant higher than that of $SiO_2$ or $SiN_x$. In an exemplary embodiment of the present disclosure, the high-k dielectric material included in the second insulating layer 111 may include one or more of, for example, hafnium oxide ($HfO_2$), hafnium silicon oxide ($HfSiO_x$), hafnium aluminum oxide ($HfAlO_x$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and lead zinc niobate ($Pb(Zn_{1/3}Nb_{2/3})O_3$).

FIG. 3 shows that the second insulating layer 111 is a single layer, but the present disclosure is not limited thereto. For example, the second insulating layer 111 may have a stack structure including multiple layers. In this case, the stack structure may be a structure in which an inorganic insulating layer including $SiO_2$, $SiN_x$, or the like is stacked on a metal layer or a metal layer doped with impurities.

A second conductive layer is formed on the second insulating layer 111. The second conductive layer may include the first to third source electrodes S1, S3-1, and S3-2 and the first to third drain electrodes D1, D3-1, and D3-2 of the first to third thin film transistors T1, T3-1, and T3-2, respectively, and may include second lines 31 supplying a driving voltage to the first to third thin film transistors T1, T3-1, and T3-2. In this case, a part of the second conductive layer 34 functions as an upper electrode of the first capacitor C1.

When the part of the first conductive layer (the first line 21) is a first conductive pattern, and the part of the second conductive layer 34 is a second conductive pattern, the first capacitor C1 may include the second conductive pattern as the upper electrode and the first conductive pattern as the lower electrode, in which the second conductive pattern is on a layer the same as that of the first to third source electrodes S1, S3-1, and S3-2 and the first to third drain electrodes D1, D3-1, and D3-2 of the first to third thin film transistors T1, T3-1, and T3-2, and the first conductive pattern overlaps at least a portion of the second conductive pattern. Similarly, the second capacitor C2 may include a third conductive pattern (the third line 13) as the upper electrode and the first gate electrode G1 of the first thin film transistor T1 as the lower electrode.

The second conductive layer contacts the active areas D1' and D3-2' of the semiconductor layer 103, and thus contact plugs 33p and 34p may be formed to connect the second conductive layer to the semiconductor layer 103.

Contact holes Cnt1 and Cnt2 for forming the contact plugs 34p and 33p, respectively, are formed in the second insulating layer 111, the first insulating layer 109, the third insulating layer 107, and the gate insulating layer 105, and enhancement in processing quality of the contact holes Cnt1 and Cnt2 penetrating the gate insulating layer 105, the third insulating layer 107, the first insulating layer 109, and the second insulating layer 111 is needed to secure quality of a high-resolution panel. Therefore, it may need to decrease skew angles of the contact holes Cnt1 and Cnt2 to approximately 0, and to enhance etching quality of the contact holes Cnt1 and Cnt2. A detailed method of enhancing the etching quality of the contact holes Cnt1 and Cnt2 will be described below with reference to FIGS. 4A to 4D.

FIGS. 4A to 4D are exemplary cross-sectional views sequentially showing processes of forming a contact hole in a region X of FIG. 3.

Figure 4A:
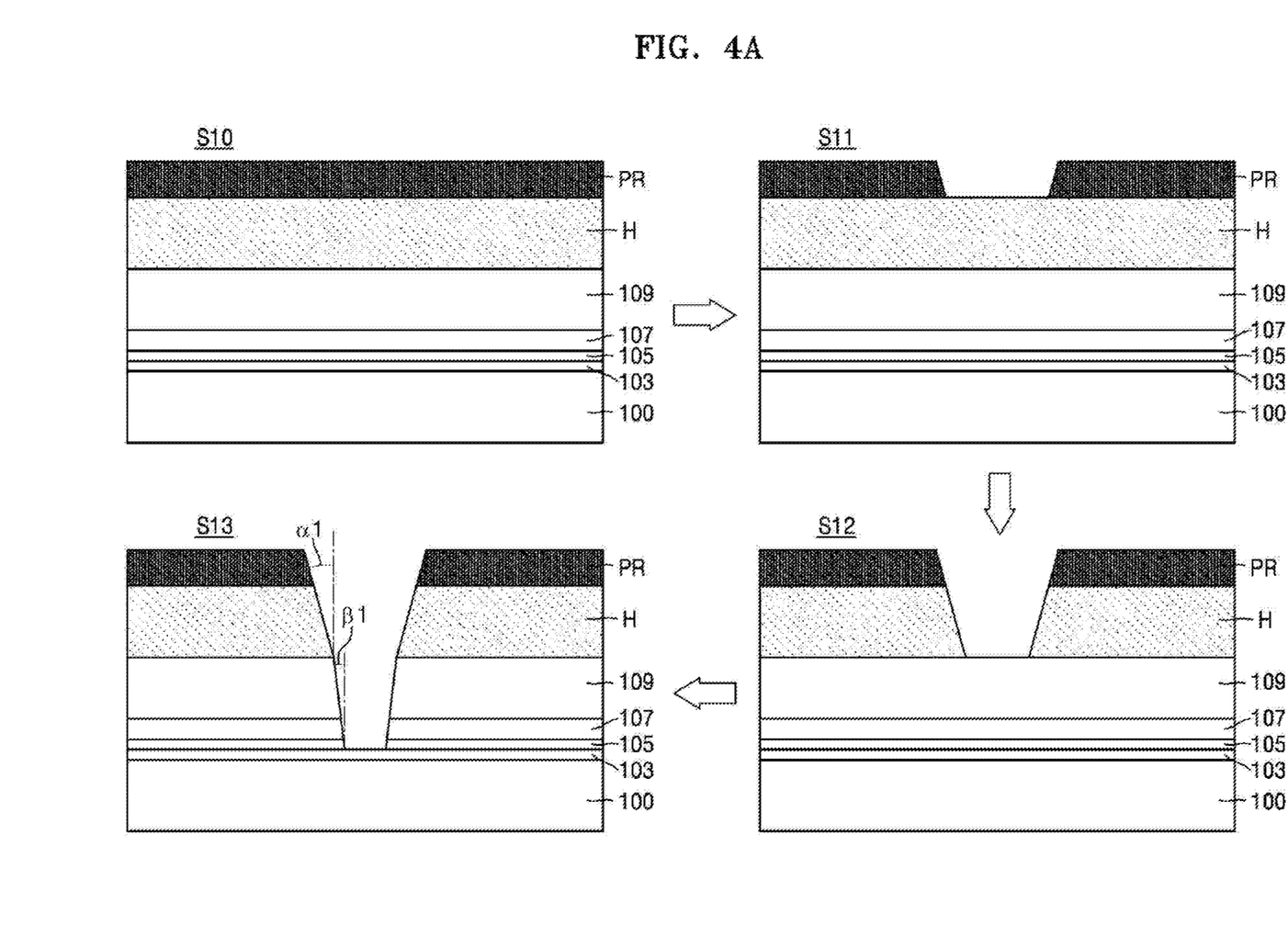
FIGS. 4A to 4D are exemplary cross-sectional views sequentially showing processes of forming a contact hole in a region X of FIG. 3.

Referring to FIG. 4A, in operation S10, a mask layer PR is formed on a thin film transistor array substrate.

As described above with reference to FIG. 3, the thin film transistor array substrate may be formed by stacking the substrate 100, the semiconductor layer 103, the gate insulating layer 105, the third insulating layer 107, the first insulating layer 109, and a second insulating layer H in sequence. In addition, a buffer layer (see buffer layer 101 of FIG. 3) may be further formed between the substrate 100 and the semiconductor layer 103. Forming the above structure for the thin film transistor array substrate may include the following process steps: forming the semiconductor layer 103 on the substrate 100; forming, on the semiconductor layer 103, the first insulating layer 109 including a first material layer; forming a first conductive layer on the first insulating layer 109; and forming, on the first conductive layer, the second insulating layer H including a second material layer. The above process steps may further include sequentially forming the gate insulating layer 105, the first gate layer, the third insulating layer 107, and the second gate layer between the semiconductor layer 103 and the first insulating layer 109.

The third insulating layer 107 includes a third material layer having a third dielectric constant, the first insulating layer 109 includes the first material layer having a first dielectric constant, and the second insulating layer H includes the second material layer having a second dielectric constant. In the present embodiment, the third dielectric constant and the first dielectric constant may be smaller than the second dielectric constant.

The second insulating layer H may include the second material layer having a high dielectric constant, and may only include single second material layer. As the second insulating layer H includes the second material layer having the high dielectric constant, capacity of a capacitor including the second insulating layer H as a dielectric layer increases such that small pixels may be effectively driven in a high-resolution panel.

In an exemplary embodiment of the present disclosure, the second insulating layer H may include at least one of $ZrO_2$, $TiO_2$, $Ta_2O_5$, $Al_2O_3$, $SrTiO_3$, and $BaTiO_3$, as a material having a high dielectric constant. In general, the second insulating layer H may include a suitable high-k dielectric material with a dielectric constant higher than that of $SiO_2$ or $SiN_x$.

The first insulating layer 109 and the third insulating layer 107 may each include a material layer having a low dielectric constant, and the first material layer included in the first insulating layer 109 and the third material layer included in the third insulating layer 107 may include, for example, $SiO_2$, $SiN_x$, or the like.

In operation S10, the mask layer PR is formed on the second insulating layer H that is an uppermost layer. In this case, the mask layer PR may include photoresist.

In operation S11, the mask layer PR is patterned.

The mask layer PR may be patterned by exposing and developing processes. Thus, an opening may be formed in the mask layer PR, and during a subsequent etching process, the insulating layers under the mask layer PR may be partially removed through this opening.

In operation S12, the second insulating layer H is wet-etched. In particular, by wet etching, a portion of the second insulating layer H, which is exposed through the opening in the mask layer PR, is removed.

Wet etching is a process of dissolving an exposed portion by using acid-based chemicals, and by such wet etching, the second insulating layer H may have an isotropic etch profile.

As described above, the second insulating layer H may include a material layer including at least one of $ZrO_2$, $TiO_2$, $Ta_2O_5$, $Al_2O_3$, $SrTiO_3$, and $BaTiO_3$, but this material layer may have low etch selectivity to a lower layer including different materials. Thus, when dry etching is performed, problems such as reversed taper shapes of the lower layers may occur. In this case, the lower layer may include, e.g., $SiO_2$, $SiN_x$, or the like, which has a lower dielectric constant than the second insulating layer H. Accordingly, wet etching having good etch selectivity and a fast etching rate is used to solve the aforementioned problem.

In operation S13, the lower layers of the second insulating layer H are dry-etched. In particular, a portion of the first insulating layer 109, which is exposed through the opening in the mask layer PR and the second insulating layer H, is removed by dry etching. Then, portions of the third insulating layer 107 and the gate insulating layer 105, which are respectively exposed through the opening, are sequentially removed such that a through hole extending from the second insulating layer H to the semiconductor layer 103 is formed. The fact that the through hole extends to the semiconductor layer 103 may indicate that the through hole penetrates a portion of the semiconductor layer 103 or a layer, e.g., the gate insulating layer 105, right above the semiconductor layer 103.

Dry etching is a process of removing exposed portions by using a reactive gas, ions in vapor, or a cracked gas, and by dry etching, the first insulating layer 109, the third insulating layer 107, and the like may have anisotropic etch profiles.

As a result of the above etching processes, a taper angle α1 of the through hole in the second insulating layer H may be greater than a taper angle β1 of the through hole in the first insulating layer 109. Here, the taper angle may be defined as an angle formed by a virtual line and a thickness direction of an etching target layer. The virtual line is a line connecting an etching start point to an etching end point in a cross-sectional view of the etching target layer. That is, an inner surface of a hole formed by wet etching may mostly have great curvature and a great width, whereas an inner surface of a hole formed by dry etching may mostly have small curvature and a small width. Thus, a taper angle formed by wet etching may be greater than a taper angle formed by dry etching.

As the above processes S10 to S13 are performed, a through hole such as the first contact hole Cnt1 of FIG. 3 may be formed in the thin film transistor array substrate. Thus, as the second insulating layer H including the material layer having the high dielectric constant is selectively wet-etched, a skew angle of a contact plug, which is formed by filling the through hole, may decrease, thereby easily implementing a high-resolution panel. After filling the through hole with a conductive material, the second conductive layer may be formed to cover the through hole over the second insulating layer H. Filling the through hole to form the contact plug and covering the through hole with the second conductive layer may use the same material and/or the same deposition process.

Figure 4B:
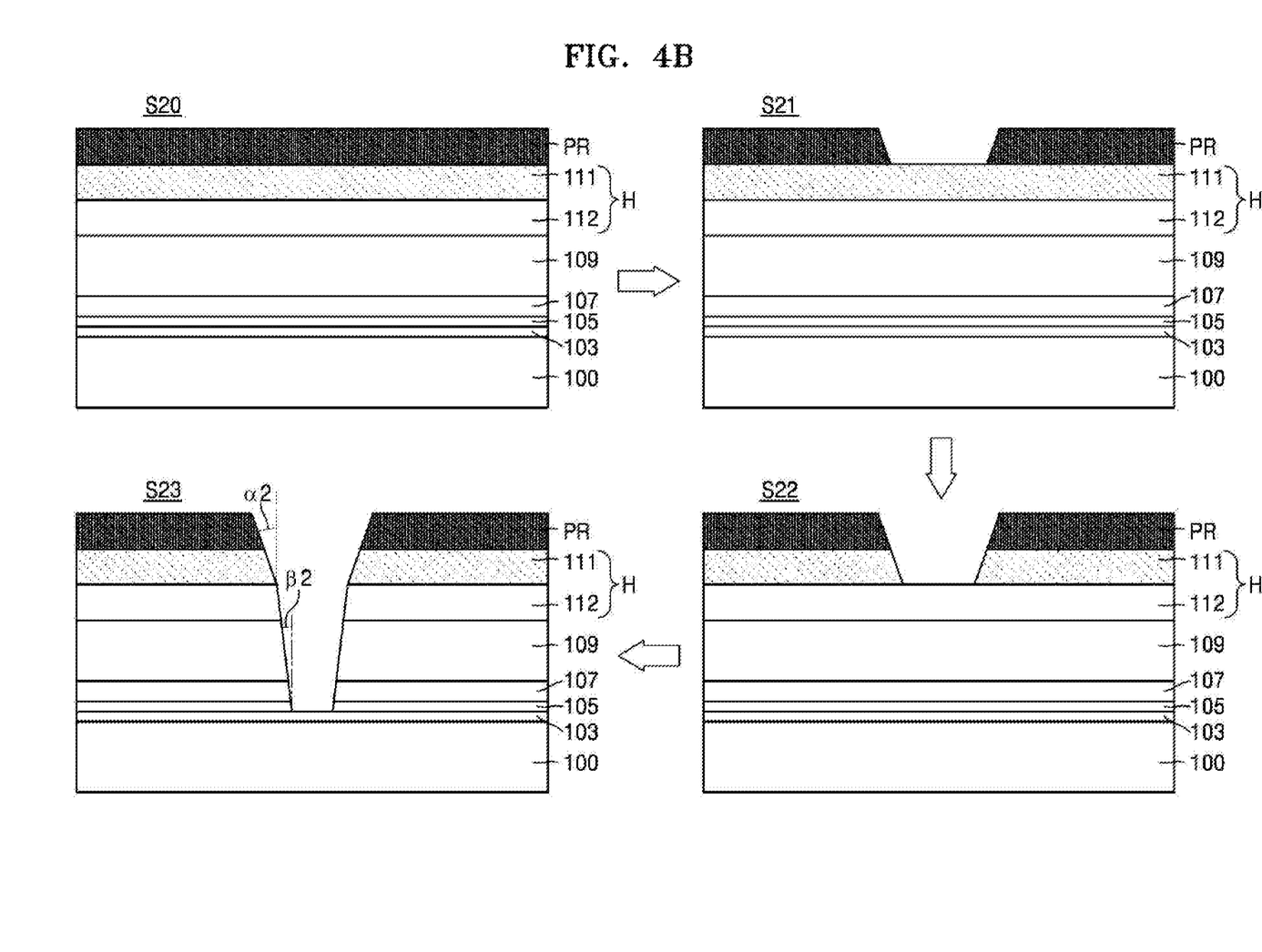

Referring to FIG. 4B, in operation S20, the mask layer PR is formed on the thin film transistor array substrate.

As described above with reference to FIG. 3, the thin film transistor array substrate may be formed by stacking the substrate 100, the semiconductor layer 103, the gate insulating layer 105, the third insulating layer 107, the first insulating layer 109, and the second insulating layer H in sequence. In addition, a buffer layer (see buffer layer 101 of FIG. 3) may be further formed between the substrate 100 and the semiconductor layer 103. In forming the above structure for the thin film transistor array substrate may include the following process steps: forming the semiconductor layer 103 on the substrate 100; forming, on the semiconductor layer 103, the first insulating layer 109 including the first material layer; forming a first conductive layer on the first insulating layer 109; and forming, on the first conductive layer, the second insulating layer H including a second material layer 111. The above process steps may further include sequentially forming the gate insulating layer 105, the first gate layer, the third insulating layer 107, and the second gate layer between the semiconductor layer 103 and the first insulating layer 109.

The third insulating layer 107 includes the third material layer having the third dielectric constant, the first insulating layer 109 includes the first material layer having the first dielectric constant, and the second insulating layer H includes the second material layer 111 having a second dielectric constant. In the present embodiment, the third dielectric constant and the first dielectric constant may be smaller than the second dielectric constant.

The second insulating layer H may include the second material layer 111 having a high dielectric constant, and may also include an additional material layer 112 to form a double layer. In this case, the additional material layer 112 may have a dielectric constant smaller than the second dielectric constant of the second material layer 111, and may include a material the same as that of the third insulating layer 107 or the first insulating layer 109. As the second insulating layer H includes the second material layer 111 having the high dielectric constant, capacity of a capacitor including the second insulating layer H as a dielectric layer increases such that small pixels may be effectively driven in a high-resolution panel.

In an exemplary embodiment of the present disclosure, the second material layer 111 may include at least one of $ZrO_2$, $TiO_2$, $Ta_2O_5$, $Al_2O_3$, $SrTiO_3$, and $BaTiO_3$, as a material having a high dielectric constant. In general, the second insulating layer 111 may include a suitable high-k dielectric material with a dielectric constant higher than that of $SiO_2$ or $SiN_x$.

The first insulating layer 109 and the third insulating layer 107 may each include a material layer having a low dielectric constant, and the first material layer included in the first insulating layer 109 and the third material layer included in the third insulating layer 107 may include, e.g., $SiO_2$, $SiN_x$, or the like. Also, the additional material layer 112 that is a lower layer of the second insulating layer H may include, e.g., $SiO_2$, $SiN_x$, or the like.

In operation S20, the mask layer PR is formed on the second insulating layer H that is an uppermost layer. In this case, the mask layer PR may include photoresist.

In operation S21, the mask layer PR is patterned.

The mask layer PR may be patterned through exposing and developing processes. Thus, an opening may be formed in the mask layer PR, and during a subsequent etching process, insulating layers under the mask layer PR may be partially removed through the opening.

In operation S22, the second insulating layer H is wet-etched. In particular, a portion of the second material layer 111 of the second insulating layer H, which is exposed through the opening in the mask layer PR, is removed by wet etching. Thus, the second material layer 111 may have an isotropic etch profile.

As described above, the second material layer 111 may include at least one of $ZrO_2$, $TiO_2$, $Ta_2O_5$, $Al_2O_3$, $SrTiO_3$, and $BaTiO_3$, but has low etch selectivity to a lower layer including different materials. Thus, when dry etching is performed, problems such as reversed taper shapes of the lower layer may occur. That is, when the second material layer 111 is dry-etched, processing quality of dry etching may degrade due to, e.g., a reversed taper shape of the additional material layer 112 that is the lower layer of the second insulating layer H. Accordingly, wet etching having good etch selectivity and a fast etching rate is used to solve the aforementioned problem.

In operation S23, the additional material layer 112 may be dry-etched along with the other lower layers.

In operation S23, the lower layers of the second insulating layer H may be dry-etched. In particular, by dry etching, a portion of the additional material layer 112, which is exposed through the opening in the mask layer PR and the second material layer 111, is removed. Portions of the first insulating layer 109, the third insulating layer 107 and the gate insulating layer 105, which are respectively exposed through the opening, are sequentially removed, and thus a through hole extending from the second insulating layer H to the semiconductor layer 103 is formed. The fact that the through hole extends to the semiconductor layer 103 may indicate that the through hole penetrates a portion of the semiconductor layer 103 or a layer, e.g., the gate insulating layer 105, right above the semiconductor layer 103. Thus, the additional material layer 112, the first insulating layer 109, the third insulating layer 107, the gate insulating layer 105, etc. may have anisotropic etch profiles.

As a result of the above etching processes, a taper angle $\alpha 2$ of the through hole in the second material layer 111 may be greater than a taper angle $\beta 2$ of the through hole in the first insulating layer 109. Here, the taper angle may be defined as an angle formed by a virtual line and a thickness direction of an etching target layer. The virtual line is a line connecting an etching start point to an etching end point in a cross-sectional view of the etching target layer. That is, an inner surface of a hole formed by wet etching may mostly have great curvature and a great width, whereas an inner surface of a hole formed by dry etching may mostly have small curvature and a small width. Thus, the taper angle of the through hole formed by wet etching is greater than the taper angle of the through hole formed by dry etching.

As the above-described operations S20 to S23 are performed, a through hole like the first contact hole Cnt1 of FIG. 3 may be formed in the thin film transistor array substrate. Thus, as the second material layer 111, which is a part of the second insulating layer H and has the high dielectric constant, is selectively wet-etched, the skew angle of the contact plug, which is formed by filling the through hole, decreases, thereby easily implementing a high-resolution panel. After filling the through hole with a conductive material, the second conductive layer may be formed to cover the through hole over the second insulating layer H. Filling the through hole to form the contact plug and covering the through hole with the second conductive layer may use the same material and/or the same deposition process.

Figure 4C:
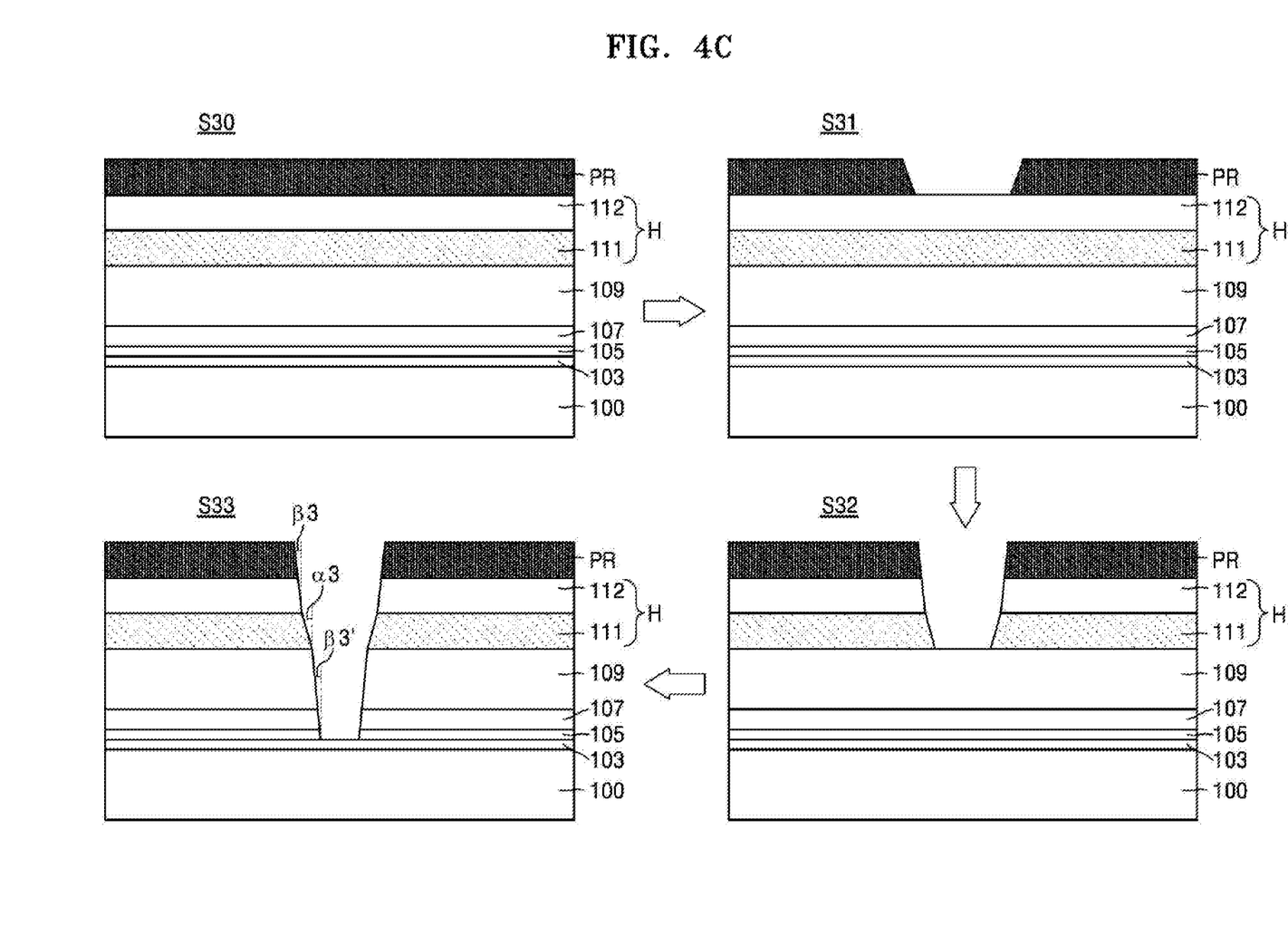

The thin film transistor array substrate of FIG. 4C has the same structure as or a similar structure to the thin film transistor array substrate of FIG. 4B except for an order of stacking the second and additional material layers 111 and 112 of the second insulating layer H. Hereinafter, differences between the manufacturing procedures of FIGS. 4B and 4C will be mainly described, and the descriptions that are already provided will be simplified or omitted.

Referring to FIG. 4C, in operation S30, the mask layer PR is formed on the thin film transistor array substrate.

The second insulating layer H may include the second material layer 111 having the high dielectric constant and may also include the additional material layer 112 to form a double layer. In this case, the additional material layer 112 may have a dielectric constant smaller than the second dielectric constant of the second material layer 111, and may include a material the same as that of the third insulating layer 107 or the first insulating layer 109. As the second insulating layer H includes the second material layer 111 having the high dielectric constant, the capacity of the capacitor including the second insulating layer H as a dielectric layer may increase as described above.

In an exemplary embodiment of the present disclosure, the second material layer 111 may include at least one of $ZrO_2$, $TiO_2$, $Ta_2O_5$, $Al_2O_3$, $SrTiO_3$, and $BaTiO_3$ as a material having a high dielectric constant. In general, the second insulating layer 111 may include a suitable high-k dielectric material with a dielectric constant higher than that of $SiO_2$ or $SiN_x$.

The first insulating layer 109 and the third insulating layer 107 may each include a material having a low dielectric constant, and the first material layer included in the first insulating layer 109 and the third material layer included in the third insulating layer 107 may include, for example, $SiO_2$, $SiN_x$, or the like. Also, the additional material layer 112 that is an upper layer of the second insulating layer H may include $SiO_2$, $SiN_x$, or the like.

After the mask layer PR is patterned in operation S31, the second insulating layer H is wet-etched in operation S32. In particular, by wet etching, the portion of the second material layer 111 of the second insulating layer H, which is exposed through the opening in the mask layer PR and the additional material layer 112, is removed. Before wet etching is performed, the additional material layer 112, which is the upper layer of the second insulating layer H, may be dry-etched.

As described above, since the additional material layer 112 may include $SiO_2$, $SiN_x$, or the like as a material having a low dielectric constant, it is better to perform dry etching than wet etching on the additional material layer 112, so as to secure good manufacturing quality. Therefore, dry etching is performed on the additional material layer 112 of the second insulating layer H, whereas wet etching having good etch selectivity and a fast etching rate is performed on the second material layer 111.

In operation S33, lower layers under the second insulating layer H are dry-etched. In particular, the portion of the first insulating layer 109, which is exposed through the opening in the mask layer PR and the second insulating layer H, is removed by dry etching. Then, the portions of the third insulating layer 107 and the gate insulating layer 105, which are respectively exposed through the opening, are sequentially removed, and thus the through hole extending from the second insulating layer H to the semiconductor layer 103 may be formed.

As a result of the above etching processes, a taper angle $\beta3$ of the through hole in the additional material layer 112 and a taper angle $\beta3'$ of the through hole in the first insulating layer 109 may each be smaller than a taper angle $\alpha3$ of the through hole in the second material layer 111. As described above, the taper angle may be defined as an angle formed by a virtual line and a thickness direction of an etching target layer. The virtual line is a line connecting an etching start point to an etching end point in a cross-sectional view of the etching target layer.

As the above-described operations S30 to S33 are performed, the through hole such as the first contact hole Cnt1 of FIG. 3, which has high manufacturing quality, may be formed in the thin film transistor array substrate.

Figure 4D:
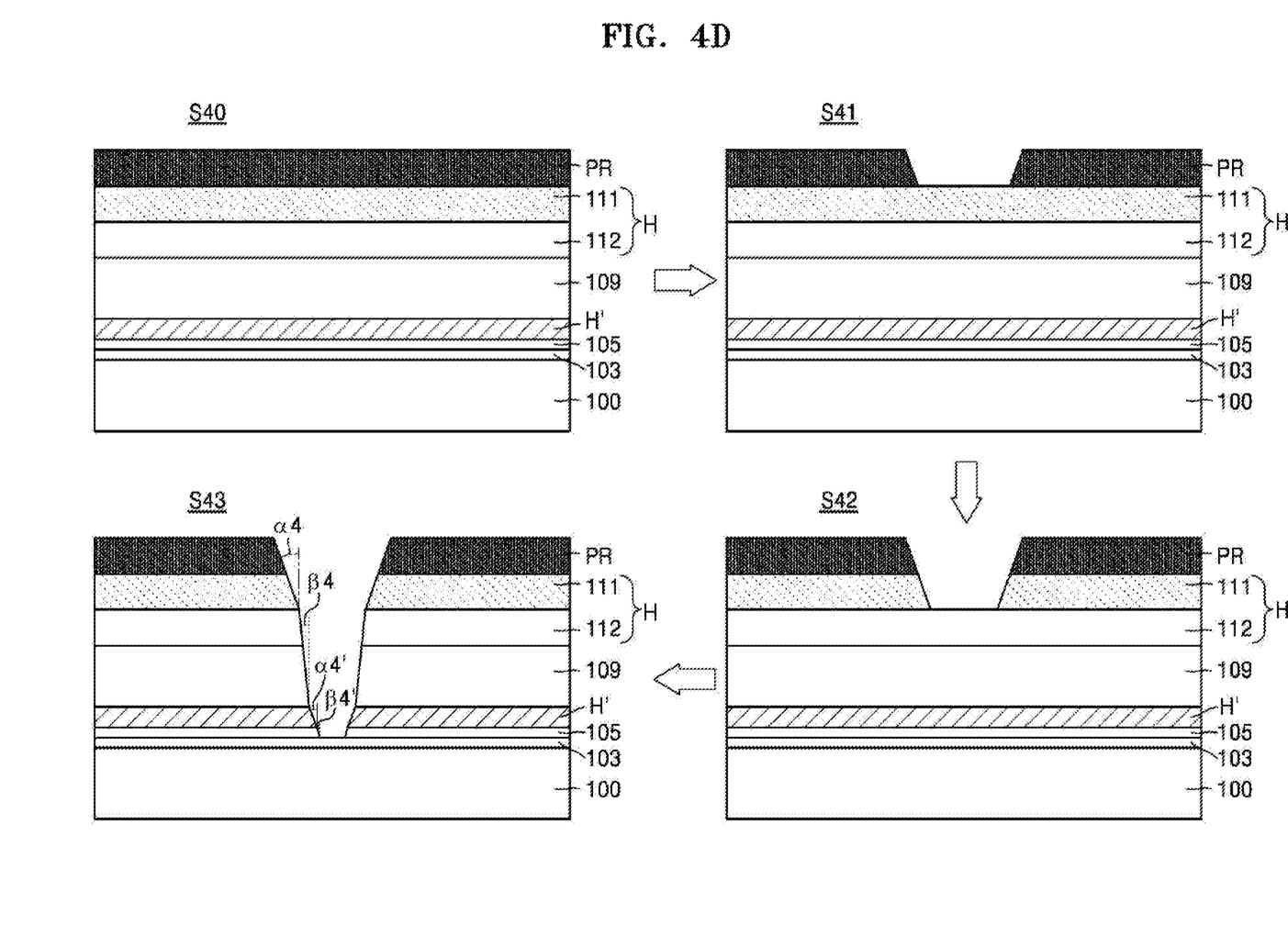

The thin film transistor array substrate of FIG. 4D has a structure the same as or similar to that of the thin film transistor array substrate of FIG. 4B except for the fact that the material layer included in the third insulating layer 107 includes a material having a high dielectric constant. Hereinafter, differences between the manufacturing procedures of FIGS. 4B and 4C will be mainly described, and the descriptions that are already provided will be simplified or omitted.

Referring to FIG. 4D, in operation S40, the mask layer PR is formed on the thin film transistor array substrate.

The second insulating layer H may include the second material layer 111 having the high dielectric constant and may also include the additional material layer 112 to form a double layer. In this case, the additional material layer 112 may have a dielectric constant smaller than the second dielectric constant of the second material layer 111 and may include a material the same as that of the first insulating layer 109. As the second insulating layer H includes the second material layer 111 having the high dielectric constant, the capacity of the capacitor including the second insulating layer H as the dielectric layer may increase.

In an exemplary embodiment of the present disclosure, the second material layer 111 may include at least one of $ZrO_2$, $TiO_2$, $Ta_2O_5$, $Al_2O_3$, $SrTiO_3$, and $BaTiO_3$, as the material having the high dielectric constant. In general, the second insulating layer 111 may include a suitable high-k dielectric material with a dielectric constant higher than that of $SiO_2$ or $SiN_x$.

The first insulating layer 109 includes the first material layer having a low dielectric constant, whereas a third insulating layer H' includes the third material layer having a high dielectric constant just as the second insulating layer H. As the third insulating layer H' includes the third material layer having the high dielectric constant, capacity of a capacitor including the third insulating layer H' as a dielectric layer may increase, and thus it may be easier to maintain a driving data voltage during one frame.

In an exemplary embodiment of the present disclosure, the third material layer included in the third insulating layer H' may include at least one of $ZrO_2$, $TiO_2$, $Ta_2O_5$, $Al_2O_3$, $SrTiO_3$, and $BaTiO_3$, as a material having a high dielectric constant. In general, the third insulating layer H' may include a suitable high-k dielectric material with a dielectric constant higher than that of $SiO_2$ or $SiN_x$. In an exemplary embodiment of the present disclosure, the high-k dielectric material included in the third insulating layer H' may include one or more of, for example, $HfO_2$, $HfSiO$, $HfAlO$, $La_2O_3$, $LaAlO_3$, $ZrO_2$, $ZrSiO_4$, $Ta_2O_5$, $TiO_2$, $BaSrTi_2O_6$, $BaTiO_3$, $SrTiO_3$, $Y_2O_3$, $Al_2O_3$, $Pb(Sc,Ta)O_3$, and $Pb(Zn_{1/3}Nb_{2/3})O_3$.

The first material layer included in the first insulating layer 109 may include, e.g., $SiO_2$, $SiN_x$, or the like. Also, the additional material layer 112 that is the lower layer of the second insulating layer H may include, e.g., $SiO_2$, $SiN_x$, or the like.

FIG. 4D shows that the third insulating layer H' is a single layer, but the present disclosure is not limited thereto. For example, the third insulating layer H' may be a double layer including a high dielectric layer and a low dielectric layer just as the second insulating layer H.

After the mask layer PR is patterned in operation S41, the second insulating layer H is wet-etched in operation S42. In particular, a portion of the second material layer 111 of the second insulating layer H, which is exposed through the opening in the mask layer PR, is removed by wet etching. Thus, the second material layer 111 may have an isotropic etch profile.

As described above, the second material layer 111 may include at least one of $ZrO_2$, $TiO_2$, $Ta_2O_5$, $Al_2O_3$, $SrTiO_3$, and $BaTiO_3$, but has low etch selectivity to a lower layer including different materials. Thus, when dry etching is performed, problems such as reversed taper shapes of the lower layer may occur. That is, when the second material layer 111 is dry-etched, the processing quality of dry etching may degrade due to, e.g., the reversed taper shape of the additional material layer 112 that is the lower layer of the second insulating layer H. Accordingly, wet etching having good etch selectivity and a fast etching rate is used to solve the aforementioned problem.

In operation S43, the additional material layer 112 may be dry-etched together with the other lower layers.

In operation S43, the lower layers under the second material layer 111 are dry-etched. In particular, the portion of the additional material layer 112, which is exposed through the opening in the mask layer PR and the second material layer 111, is removed by dry etching. In this case, after the removal of the additional material layer 112 of the second insulating layer H, the first insulating layer 109 may also be dry-etched.

In operation S43, wet etching is selectively performed on the third insulating layer H'. That is, since the third insulating layer H' may include at least one of $ZrO_2$, $TiO_2$, $Ta_2O_5$, $Al_2O_3$, $SrTiO_3$, and $BaTiO_3$, wet etching having good etch selectivity and a fast etching rate is performed to remove the third insulating layer H' so as to prevent degradation of the processing quality of the lower layers.

The portion of the gate insulating layer 105, which is exposed through the opening, is removed by dry etching, and thus the through hole extending from second insulating layer H to the semiconductor layer 103 may be formed.

As a result of the above etching processes, a taper angle $\alpha4$ of the through hole in the second material layer 111 may be greater than a taper angle $\beta4$ of the through hole in the first insulating layer 109. The taper angle $\beta4$ of the through hole in the first insulating layer 109 may be smaller than a taper angle $\alpha4'$ of the through hole in the third insulating layer H', and the taper angle $\alpha4'$ of the through hole in the third insulating layer H' may be greater than a taper angle $\beta4'$ of the through hole in the gate insulating layer 105. As described above, the taper angle may be defined as the angle formed by the virtual line and the thickness direction of the etching target layer. The virtual line is the line connecting the etching start point to the etching end point in a cross-sectional view of the etching target layer.

As the above processes S40 to S43 are performed, the through hole such as the first contact hole Cnt1 of FIG. 3 which has high manufacturing quality may be formed in the thin film transistor array substrate. Also, as both the second insulating layer H and the third insulating layer H' include the materials having the high dielectric constants, capacity of a capacitor suitable for a high-resolution panel may be secured.

According to a display apparatus according to an exemplary embodiment of the present disclosure, capacity of a capacitor for driving a high-resolution panel may be secured. Also, the high-resolution panel may have enhanced brightness and gradation quality in grayscale, and manufacturing quality of the high-resolution panel may be enhanced without performing an additional photolithography process.

It should be understood that the specific exemplary embodiments of the present disclosure described herein should be considered in a descriptive sense only and not for purposes of limitation. Descriptions of features or aspects within each exemplary embodiment should typically be considered as available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:

1. A method of manufacturing a thin film transistor array substrate, the method comprising:
   forming a semiconductor layer on a substrate;
   forming, on the semiconductor layer, a first insulating layer comprising a first material layer having a first dielectric constant;
   forming a first conductive layer on the first insulating layer;
   forming, on the first conductive layer, a second insulating layer comprising a second material layer having a second dielectric constant greater than the first dielectric constant;
   forming, on the second insulating layer, a mask layer comprising an opening;
   removing a portion of the second insulating layer exposed by wet etching through the opening;
   forming a through hole extending to the semiconductor layer by removing a portion of the first insulating layer exposed by dry etching through the opening; and
   forming a second conductive layer to cover the through hole,
   wherein a first taper angle of the opening in the second insulating layer is greater than a second taper angle of the through hole in the first insulating layer.

2. The method of claim 1, wherein the second material layer comprises at least one of zirconium oxide ($ZrO_2$), titanium oxide ($TiO_2$), tantalum pentoxide ($Ta_2O_5$), aluminum oxide ($Al_2O_3$), strontium titanate ($SrTiO_3$), or barium titanate ($BaTiO_3$).

3. A method of manufacturing a thin film transistor array substrate, the method comprising:
   forming a semiconductor layer on a substrate;
   forming, on the semiconductor layer, a first insulating layer comprising a first material layer having a first dielectric constant;
   forming a first conductive layer on the first insulating layer;
   forming, on the first conductive layer, a second insulating layer comprising a second material layer having a second dielectric constant greater than the first dielectric constant;
   forming, on the second insulating layer, a mask layer comprising an opening;
   removing a portion of the second insulating layer exposed by wet etching through the opening;
   forming a through hole extending to the semiconductor layer by removing a portion of the first insulating layer exposed by dry etching through the opening; and
   forming a second conductive layer to cover the through hole,
   wherein the method further comprising sequentially forming a first gate layer, a third insulating layer, and a second gate layer between the semiconductor layer and the first insulating layer.

4. The method of claim 3, wherein the third insulating layer comprises a third material layer having a third dielectric constant, and
   the third dielectric constant is greater than the first dielectric constant.

5. The method of claim 4, wherein the third material layer comprises at least one of $ZrO_2$, $TiO_2$, $Ta_2O_5$, $Al_2O_3$, $SrTiO_3$, or $BaTiO_3$.

6. The method of claim 4, wherein the forming of the through hole comprises removing a portion of the third insulating layer exposed by wet etching through the opening.

7. A method of manufacturing a thin film transistor array substrate, the method comprising:
   forming a semiconductor layer on a substrate;
   forming, on the semiconductor layer, a first insulating layer comprising a first material layer having a first dielectric constant;
   forming a first conductive layer on the first insulating layer;
   forming, on the first conductive layer, a second insulating layer comprising a second material layer having a second dielectric constant greater than the first dielectric constant;
   forming, on the second insulating layer, a mask layer comprising an opening;
   removing a portion of the second insulating layer exposed by wet etching through the opening;
   forming a through hole extending to the semiconductor layer by removing a portion of the first insulating layer exposed by dry etching through the opening; and
   forming a second conductive layer to cover the through hole,
   wherein the forming of the second conductive layer comprises forming a contact plug that connects the second conductive layer to the semiconductor layer by filling the through hole.

8. The method of claim 3, wherein a first taper angle of the opening in the second insulating layer is greater than a second taper angle of the through hole in the first insulating layer.

9. The method of claim 7, wherein a first taper angle of the opening in the second insulating layer is greater than a second taper angle of the through hole in the first insulating layer.

* * * * *